United States Patent [19]

Nagasaka et al.

[11] Patent Number: 4,799,228
[45] Date of Patent: Jan. 17, 1989

[54] TRANSVERSE-MODE STABILIZED SEMICONDUCTOR LASER DIODE WITH SLAB-COUPLED WAVEGUIDE

[75] Inventors: Hiroko Nagasaka, Yokohama; Gen-ichi Hatakoshi, Yokohama; Naohiro Shimada, Yokahama; Motoyuki Yamamoto, Kawasaki; Masaki Okajima, Kunitachi; Yoshio Iizuka, Yokohama; Hatsumi Kawata, Tokyo; Hideaki Kinoshita, Yokohama; Nobuyuki Matsuura, Yokohama, all of Japan

[73] Assignee: Kabushiki Kaisha Toshiba, Kawasaki, Japan

[21] Appl. No.: 898,706

[22] Filed: Aug. 21, 1986

[30] Foreign Application Priority Data

Aug. 23, 1985 [JP] Japan ................................ 60-185531
Aug. 23, 1985 [JP] Japan ................................ 60-185532

[51] Int. Cl.$^4$ ............................................. H01S 3/19
[52] U.S. Cl. .................................... 372/46; 372/45; 357/16; 357/17
[58] Field of Search ............... 372/44, 45, 46; 357/17, 357/16

[56] References Cited

U.S. PATENT DOCUMENTS

| 4,329,660 | 5/1982 | Yano et al. | 372/46 |
| 4,635,268 | 1/1897 | Motegi et al. | 372/45 |

FOREIGN PATENT DOCUMENTS

| 0042585 | 12/1981 | European Pat. Off. | |
| 0148021 | 7/1985 | European Pat. Off. | 372/46 |
| 3410793 | 10/1984 | Fed. Rep. of Germany | |
| 0028281 | 3/1977 | Japan | 372/45 |
| 545273 | 3/1979 | Japan | |
| 575070 | 1/1982 | Japan | |
| 2105099 | 3/1983 | United Kingdom | |

OTHER PUBLICATIONS

M. Okajima et al., Japanese Journal of Applied Physics, Supplement Extended Abstracts of the 16th Conference on Solid State Devices, Aug. 30 and Sept. 1, 1984, pp. 153–156 "A New Transverse-Mode Stabilized GaAlAs etc.".

Patent Abstracts of Japan, vol. 1, No. 52, May 20, 1977, JP-A-51 147 985.

Patent Abstracts of Japan, vol. 9, No. 204, Aug. 21, 1985, JP-A-60 66 894.

H. Kressel et al., "Large-Optical-Cavity (AlGa) As-GaAs Heterojunction Laser Diode: Threshold and Efficiency" J. Appl. Phys. vol. 43, No. 2, Feb. 1972, pp. 561–567.

Coleman et al., "Single-Longitudinal-Mode Metalorganic Chemical-Vapor-Deposition Self-Aligned GaAlAs-GaAs Double-Heterostructure Lasers", Appl. Phys. Lett., 37(3) Aug. 1, 1980, pp. 262–263.

Chinn et al., "TE Modes of Graded-Index Large-Optical-Cavity Waveguides", Optics Communications, vol. 40, No. 3, Jan. 1, 1982, pp. 179–184.

Turley, "Optical Waveguiding in (In, Ga) (As, P) Inverted Rib Waveguide Lasers at 1.3 μm Wavelength", IEEE Journal of Quantum Electronics, vol. QE-19, No. 7, Jul. 1983, pp. 1186–1195.

Technical Digest of the International Electron Devices, Wash. D.C., US 5th–7th Dec. 1983, pp. 292–295, IEEE, New York, M. Okajima et al., "Transverse-Mode Stabilized GaAlAs Laser with Embedded Confining Layer etc.", p. 292.

Patents Abstracts of Japan, vol. 6, No. 123, (E–117) [1001], 8th Jul. 1982; JP-A-57 49 289 (Mitsubishi Denki K.K.).

Patents Abstract of Japan, vol. 6, No. 144, (E–122) [1022], 3rd Aug. 1982; JP-A-57 66 685 (Nippon Denki K.K.) 22-04-1982.

Abstracts of the 32th Domestic Meetings on Applied Physics in Japan, (1985) 131, H. Nagasaka et al.

*Primary Examiner*—William L. Sikes
*Assistant Examiner*—Georgia Y. Epps
*Attorney, Agent, or Firm*—Oblon, Fisher, Spivak, McClelland & Maier

[57] ABSTRACT

A semiconductor laser diode includes two semiconductive cladding layers of different conductivity types, which are stacked on a substrate. An active layer of an undoped semiconductor film is sandwiched between the cladding layers. A channel groove is formed in a current blocking layer and the underlying cladding layer, to be deep enough to cause the current blocking layer to be divided into two parts. A waveguide layer covers the channel groove and the current-blocking layer, to provide a slab-coupled waveguide structure for transverse mode oscillation. The second cladding layer, the current-blocking layer, and the waveguide layer are composed of gallium arsenide containing aluminum.

7 Claims, 4 Drawing Sheets

TRANSVERSE-MODE STABILIZED SEMICONDUCTOR LASER DIODE WITH SLAB-COUPLED WAVEGUIDE

Background of the Invention

The present invention relates to a semiconductor laser and in particular, to a semiconductor laser diode with a slab-coupled waveguide structure.

Recently, considerable effort has been devoted to the development of semiconductor laser diodes, which are in growing demand for an optical pick-up for writing and reading digital data into and from an optical disc, such as a digital audio disc, a high-density optical disc memory, etc. In particular, GaAs system laser diodes with fundamental transverse mode oscillation have been most widely used because of their large oscillation power and low threshold level.

One such semiconductor laser diode has been disclosed in "Extended Abstract of the 16th Conference on Solid State Devices and Materials", Kobe (1984), pp. 153–156. This laser diode is known as a transverse-mode stabilized semiconductor laser with a slab-coupled waveguide, which includes a first n-GaAlAs cladding layer, an undoped GaAlAs active layer, a second n-GaAlAs cladding layer, and an n-GaAs current blocking layer, which are sequentially stacked one above another on one side of an n-GaAs substrate. A stripe-like channel groove is defined in the current blocking layer and its underlying cladding layer. The groove is deep enough to penetrate the current blocking layer, and its bottom portion is positioned near the underlying active layer. A thin p-GaAlAs layer whose refractive index is larger than that of the cladding layer is formed, as a waveguide layer, to cover the groove and the current blocking layer, so that the waveguide layer can be introduced sufficiently near the top surface of the active layer inside the channel groove. Also stacked on the p-GaAlAs layer are a p-GaAlAs overcoating layer, a p-GaAlAs contact layer, and a metal electrode layer. The multi-layered configuration thus obtained forms a so-called slab-coupled waveguide structure.

In such a GaAlAs laser with a slab-coupled waveguide, transverse mode oscillation is carried out in such a manner that oscillated laser light is shut up in the groove by refractive index guiding, which is due to the difference between refractive indexes measured at the groove and the other portion of the multi-layer structure. Such a waveguide structure is favorable for high power laser oscillation, since the optical field spreads sufficiently in the cladding layer, as in a large optical cavity structure.

The disadvantage of this semiconductor laser is that the fundamental transverse oscillation mode becomes unstable when the laser oscillation power thereof is greatly increased. Our experiment revealed that the laser oscillation could no longer be kept stable when the laser power was set at more than 30 mW. This is because a leakage current flowing at the groove edge portions toward the peripheral regions of the cladding layer increases, thereby degrading the inner quantum efficiency of the laser diode. The decrease in stability of the laser oscillation at high power also causes the laser diode's reliability to be reduced. When the laser diode is used to optically write digital data into an optical disc, high-power laser beam radiation is generally required. Accordingly, the aforementioned problem is a serious obstacle to successful application of the laser diode to an optical pick-up unit for a read/write laser disc memory device.

Moreover, it is difficult to manufacture uniformly the aforementioned channel groove in the multi-layered laser diode, because a deep-etching process is required to form the channel groove, which extends along the surface the thick cladding layer (which must be of a thickness sufficient to maintain a large distance between the active layer and the waveguide layer in a flat layer region—with the exception of the groove), thereby causing the bottom of the channel grove to lie close to the underlying active layer. It is very difficult in the actual manufacturing process to control the deep-etching conditions, so as to maintain uniformity, in the partial removal of the cladding layer, among a great number of laser diodes to be manufactured.

SUMMARY OF THE INVENTION

It is therefore an object of the present invention to provide a new and improved semiconductor laser diode with a slab-coupled waveguide which can improve the stability in high power laser oscillation.

It is another object of the present invention to provide a new and improved semiconductor laser diode with a slab-coupled waveguide, which can improve the stability high power in high power laser oscillation and which can be uniformly manufactured by using a known etching process.

In accordance with the above object, the present invention is addressed to a specific semiconductor laser diode which includes a semiconductive substrate of a first conductivity type. Two semiconductive cladding layers are stacked on the substrate to sandwich therebetween an active layer of an undoped semiconductor thin film. The upper and lower semiconductive cladding layers are of first and second conductivity types, respectively.

A semiconductive current blocking layer of the first conductivity type is formed on the upper cladding layer. A channel groove is defined in the current blocking layer and the upper cladding layer. The bottom surface of the channel groove is positioned near the underlying active layer. A semiconductive waveguide layer of the second conductivity type is formed to cover the channel groove and the current blocking layer. The refractive index of the waveguide layer is higher than that of the upper cladding layer. The waveguide layer includes a channel layer which is recessed in accordance with the channel groove configuration, to provide a slab-coupled waveguide structure for transverse mode oscillation. A semiconductive overcoating layer of the second conductivity type is formed on the waveguide layer. This overcoating layer has a lower refractive index than that of the waveguide layer.

In such a multi-layered structure, not only the upper cladding layer and the waveguide layer, but the current blocking layer, which is sandwiched between these two layers, is comprised of a compound semiconductor containing aluminum. Accordingly, the lattice matching characteristic in the first interface between the upper cladding layer and the current blocking layer and the second interface between the current blocking layer and the waveguide layer can be improved to decrease the light absorption coefficient of the current blocking layer. As a result, the thickness of the upper cladding layer required can also be reduced, to eliminate the current leakage outside the channel groove in the semiconductor laser diode.

The invention, and its objects and advantages, will become more apparent in the detailed description of a preferred embodiment presented below.

BRIEF DESCRIPTION OF THE DRAWINGS

In the detailed description of a preferred embodiment of the invention presented below, reference is made to the accompaying drawings in which.

DETAILED DESCRIPTION OF THE PREFERRED EMBODIMENT

Figure 1:
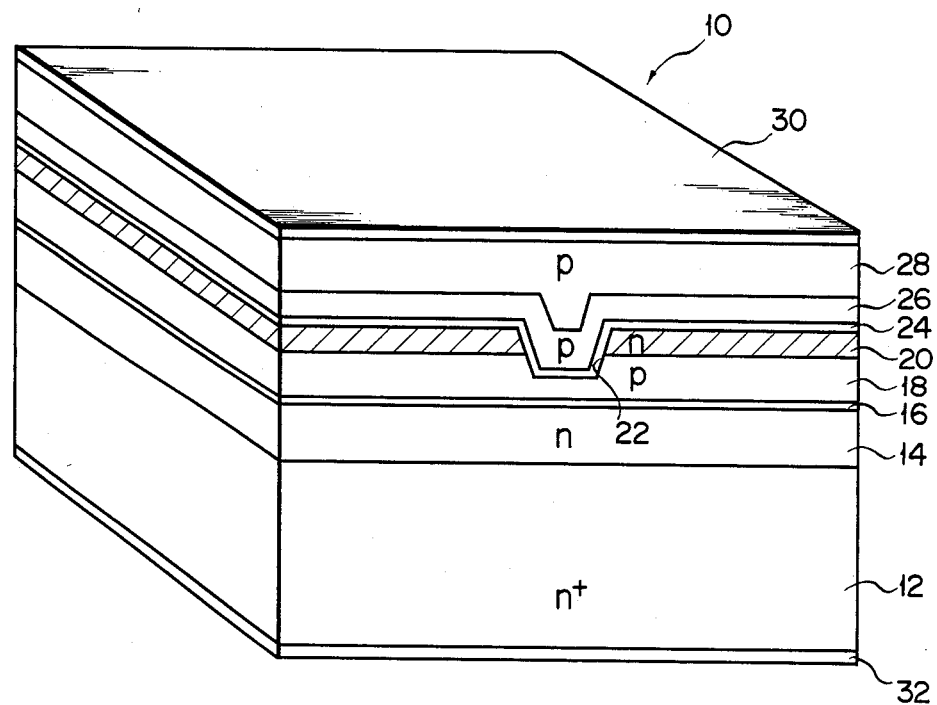
FIG. 1 shows a perspective view of a transverse-mode stabilized GaAlAs laser diode with a slab-coupled waveguide, in accordance with one preferred embodiment of the invention (not drawn to scale).

There is shown in FIG. 1 of the drawings a transverse-mode stabilized GaAlAs laser diode with a slab-coupled waveguide, which is designated generally by the numeral 10. Laser diode 10 has an n-type GaAs substrate 12 of a high impurity concentration. On one side of substrate 12 are stacked, one above another, an n-type GaAlAs cladding layer (first cladding layer) 14, an undoped GaAlAs active layer 16, a p-type GaAlAs cladding layer (second cladding layer) 18 and an n-type GaAlAs current blocking layer 20.

A stripe-like channel groove 22 is defined in current blocking layer 20 and cladding layer 18. Channel groove 22 penetrates current blocking layer 20 to extend into cladding layer 18. The bottom portion of channel groove 22 is thus positioned near the underlying active layer 16. The distance between the bottom of channel groove 22 and active layer 16 is thus smaller than that between current-blocking layer 20 and active layer 16.

A thin p-type GaAlAs layer 24 whose refractive index is larger than that of the second cladding layer 18 is formed, as a waveguide layer, to cover channel groove 22 and current blocking layer 20, so that this waveguide layer 24 can also be introduced sufficiently near the top surface of active layer 16 inside channel groove 22. On the waveguide layer 24 are further stacked a p-type GaAlAs overcoating layer 26 and a p-type GaAlAs contact layer 28. Metal layers 30 and 32 are provided to sandwich the above laser diode 10, as shown in FIG. 1, to serve as electrodes therefor. The multi-layered configuration thus obtained forms a so-called slab-coupled waveguide structure.

Figure 2A:
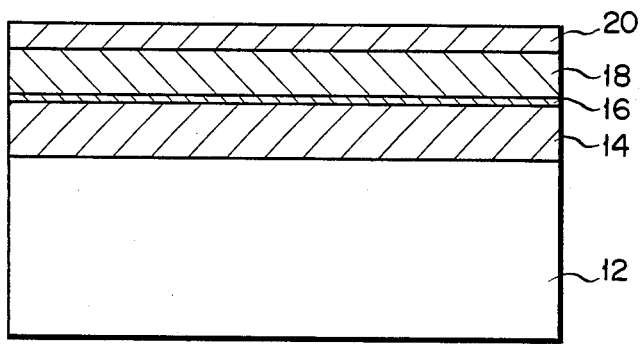
FIGS. 2A to 2C shown cross-sectional views of multi-layered structures of the laser diode, which are sequentially obtained in the main steps of a manufacturing process of the semiconductor laser diode shown in FIG. 1 (not drawn to scale).

An example of the above-mentioned laser diode 10 was manufactured by the manufacturing steps to be described below. First, as shown in FIG. 2A, first cladding layer 14, active layer 16, second cladding layer 18, and n-type GaAlAs layer 20 serving as a current blocking layer were sequentially disposed using a metal organic chemical vapor deposition method (MOCVD method) on n-GaAs substrate 12, whose top surface had a (100) crystallographic plane. In the above multi-layered diode, careful attention must be paid that not only second cladding layer 18 and waveguide layer 24 but also current blocking layer 20 sandwiched therebetween are comprised of a gallium arsenide semiconductor containing aluminum. In this example, first cladding layer 14 was made of an n-type $Ga_{0.6}Al_{0.4}As$ layer, and active layer 16 and second cladding layer 18 were made of an undoped $Ga_{0.94}Al_{0.06}As$ layer and a p-type $Ga_{0.6}Al_{0.4}As$ layer, respectively. Current blocking layer 20 was made of an n-type $Ga_{0.65}Al_{0.35}As$ layer. Layers 14, 16, 18, and 20 had thicknesses of 0.7 $\mu$m, 0.06 $\mu$m, 0.7 $\mu$m, and 0.7 $\mu$m, respectively. This multi-layered structure may be formed by liquid phase epitaxy (the LPE method); however, it is more preferable to use the MOCVD method, in terms of mass producibility.

Figure 2B:
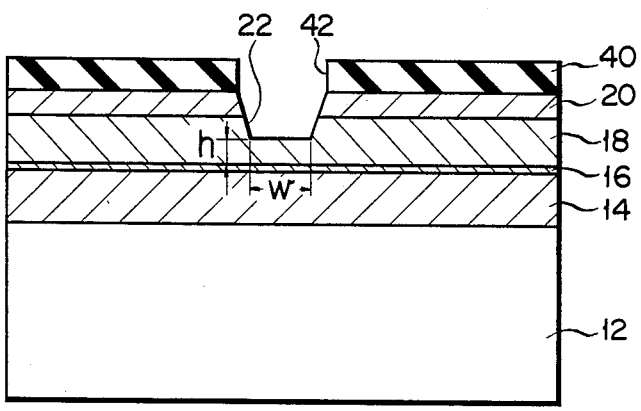
Figure 2C:
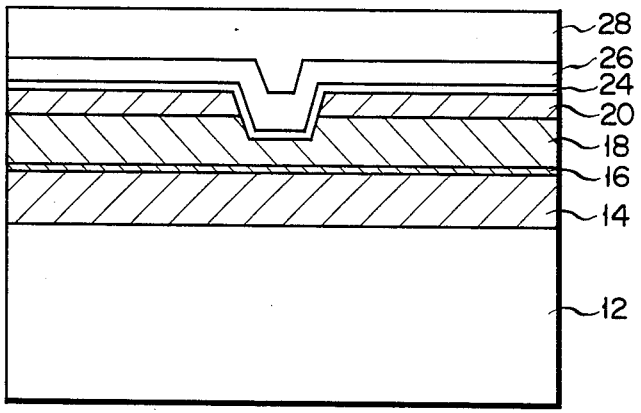

Photoresist film layer 40 was then deposited on the top layer or current blocking layer 20 of the multi-layered structure. 1.5 $\mu$m width stripe-like channel opening 42 (a so-called lwindowl) was formed in photoresist layer 40 using a known etching process. The underlying current blocking layer 20 and second cladding layer 18 were partially etched by a known etching process to form channel groove (which is commonly called "stripe" in the field of the art) 22 therein. In a vertical section, channel groove 22 extended through layer 20 and slightly into layer 18. As shown in FIG. 2B, channel groove 22 had a trapezoidal sectional configuration with slanted side walls and a bottom portion.

In the laser diode example, width w of the bottom surface was set to be 1 $\mu$m, and vertical distance h between the groove bottom surface and active layer 16 was set to be 0.4 $\mu$m. Since the thickness of second cladding layer 18 was 0.7 $\mu$m, the penetration depth of channel groove 22, in second cladding layer 18, was as small as 42%. The total depth from the upper surface of current blocking layer 20 to channel groove 22 was about 1 $\mu$m. The configuration of the channel groove was due to the chemical composition of layer 20, and the importance thereof will be described hereinafter in detail.

After the formation of channel groove 22, described above, photoresist layer 40 was removed and the exposed top surface of the multi-layered structure was washed. Next, the second crystal growth step was begun. In this step, waveguide layer 24, overcoating layer 26, and contact layer 28 were stacked on the multi-layered structure having channel groove 22, using the MOCVD method. In the laser diode examples, waveguide 24 was made of a 0.2 $\mu$m thick p-type $Ga_{0.73}Al_{0.27}As$ layer, overcoating layer 26 was comprised of a 1.25 $\mu$m thick p-type $Ga_{0.6}Al_{0.4}As$ layer, and contact layer 28 was comprised of a 5 $\mu$m thick p-GaAlAs layer. Thereafter, chromium-gold (Cr-Au) and gold-germanium (Au-Ge) alloy layers, as metal layers 30 and 32, were respectively formed on the upper and lower portions of the structure. As a result, laser diode 10 shown in FIG. 1 complete.

The resultant structure was cleaved into a Fabry-Perot laser having a resonator length of 250 $\mu$m. The element had the characteristics of a low threshold current of 35 mA and a good differential quantum efficiency of 50%. In addition, current-light output characteristics having good linearity without kink were obtained at an output of 50 mW or more. Furthermore, it was found that the beam waist of the laser light beam radiated from the laser end surface corresponded to the end surface in the horizontal and vertical directions and was a good refractive index guide.

According to the laser diode with the slab-coupled waveguide structure of the present invention, not only second cladding layer 18 and waveguide layer 24, but also current blocking layer 20 sandwiched therebetween, are comprised of a gallium arsenide semiconductor (GaAlAs) containing aluminum, as described above. Therefore, the stability of high power laser oscillation can be improved and, at the same time, good configuration control of channel grooves in mass produced laser diodes can be performed. The reasons are as follows:

First, if current blocking layer 20 (which is sandwiched between cladding layer 18 and waveguide layer 24) is comprised of a gallium arsenide semiconductor (GaAlAs) containing aluminum, like the chemical composition of layers 18 and 24, a crystal junction characteristic (the lattice matching characteristic) of layer 20, with respect to layers 18 and 24, can be improved. Therefore, the inherent stress at interfaces between layer 20 and layers 18 and 24 can be eased. As a result, since the stress-generated degradation of laser oscillation can be reduced to 1/10 or less, the operational reliability of a laser diode of this type can be greatly improved.

Second, if current blocking layer 20 is comprised of a gallium arsenide semiconductor (GaAlAs) containing aluminum, like cladding layer 18 and waveguide layer 24, the refractive index, together with the light absorption coefficient of current blocking layer 20, can be reduced. Accordingly, the thickness of underlying cladding layer 18 itself can be reduced as compared to a conventional structure. At the same time, since the depth of channel groove 22, formed in layer 18, can be reduced as compared to the conventional structure, vertical distance h, between the groove bottom surface and active layer 16, can be set to a comparatively high value. Since this equivalently means that the edges of groove 22 are kept far away from active layer 16, current leakage of the laser beam, which is confined in channel groove 22 and flows from the groove (i.e., toward cladding layer 18), can be eliminated. As a result, the threshold level of laser diode 10 can be decreased, and fundamental transverse mode oscillation characteristics (high power and low astigmatism) can be improved. In addition, if the content (composition ratio) of aluminum in layer 20 is set higher, layer 18 can be formed thinner, and further improvement in the fundamental transverse mode oscillation characteristics of laser diode 10 can be expected. According to an experiment by the present inventors, when the composition ratio of aluminum in layer 20 was, e.g., 0.4, the refractive index of layer 20 was substantially the same as that of layer 18.

Third (which is related to the above second feature), as a result of the formation of thin layer 18 and shallow groove 22, etching depth in layer 18, required to form groove 22, can be reduced. Therefore, channel groove 22, the configuration of which is well controlled, can be formed with ease, without using deep etching. As a result, in the manufacturing steps of the laser diode 10, reproducibility of channel groove 22 can be maximally improved and the yield of the laser diodes can also be improved.

Figure 3:
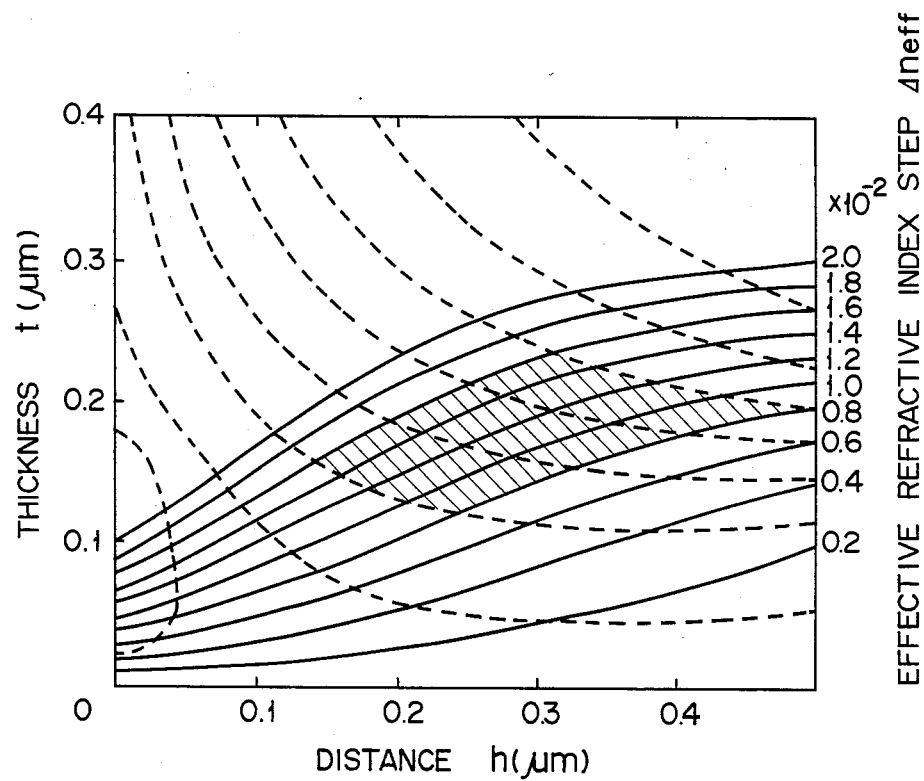
FIG. 3 shows calculated curves of the coefficient of laser light confinement vs. the thickness (t) of the waveguide layer, the waveguide layer-active layer spacing (h) and the effective refractive index step ($\Delta$neff) in the semiconductor laser diode shown in FIG. 1.

On the contrary, the above-described conventional semiconductor laser diode using the GaAs semiconductor layer, but not containing aluminum as a current-blocking layer, has poor mass-productivity characteristics and poor stability in transverse mode oscillation. FIG. 3 shows a graph of effective refractive index step $\Delta$neff (which is defined as the difference between the refractive index of the channel groove and that of flat portions—with the exception of the groove in the laser diode) and laser light confinement factor $\tau$, with respect to distance h ($\mu$m) between active and waveguide layers and thickness t ($\mu$m) in the stripe-like channel groove of the laser diode having the conventional structure. The calculation was performed assuming aluminum contents in cladding, active, cladding, waveguide, and coating layers were 0.4, 0.06, 0.4, 0.27, and 0.4, respectively, and the thickness of an active layer was 0.06 $\mu$m.

In order to obtain a stabilized transverse mode in a laser diode, $\Delta$neff which compensates for refractive index reduction caused by the plasma effect and the like, is required, and it was experimentally found that the stabilized fundamental transverse mode can be obtained when $\Delta$neff is about $10^{-2}$. When laser light confinement factor $\tau$ is too small, the threshold value becomes large, and too large $\tau$ leads to degradation in high power operation. Therefore, the laser light confinement factor must also be carefully selected. For example, when the proper range of $\theta$Oeff is 0.8 to $1.6 \times 10^{-2}$ and the proper range of factor $\tau$ is 0.06 to 0.12, the allowable range of t and h is the crosshatched region in FIG. 3. Accordingly, the value of h, as well as the value of t, must be accurately set. In the conventional structure, however, since the amount of etching for the formation of a stripe-like channel groove is about ten times the value of h, variations in h cannot be eliminated and the mass production yield is poor.

Another semiconductor laser diode manufactured according to the concept of the present invention will now be described.

First, first cladding layer 14 (having a selenium concentration of $1 \times 10^{17}$ cm$^{-3}$) of a 1.5 $\mu$m thick n-type $Ga_{0.6}Al_{0.4}As$ layer was formed on n-type GaAs substrate 12 (having a silicon concentration of $1 \times 10^{18}$ cm$^{-3}$) whose top surface had a (100) crystallographic plane. Next, active layer 16 of a 0.08 $\mu$m thick n-type undoped $Ga_{0.92}Al_{0.08}As$ layer, second cladding layer 18 of a 0.7 $\mu$m thick p-type $Ga_{0.6}Al_{0.4}As$ layer, and current blocking layer 20 of a 0.7 $\mu$m thick n-type $Ga_{0.6}Al_{0.04}As$ layer were sequentially formed on cladding layer 14. The MOCVD method was used to form the layers 14, 16, 18, and 20. In this embodiment, not only second cladding layer 18 and waveguide layer 24, but also current blocking layer 20, which is sandwiched therebetween, were comprised of a galluim arsenide semiconductor as in the above-described multi-layered laser diode.

This first crystal growth used an MOCVD method and had as its growth conditions: a substrate temperature of 750° C. V/III=20. a flow rate of carrier gas (H$_2$) of 10 l/min: trimethylgallium (TMG: (CH)$_3$ Ga), trimethyl-aluminum[TMA: (CH$_3$)$_3$Al], and arsine (AsH$_3$) as source materials. diethylzinc [DEZ: (C$_2$H$_5$)$_2$Zn] as a p-dopant. hydrogen selenide (H$_2$Se) as an n-dopant. and a growth rate of 0.25 $\mu$m/min. It is not necessary to use the MOCVD method for the first crystal growth, but it is more advantageous to do so since the MOCVD method realizes a crystal growth having a large area and good uniformity in terms of mass producibility, unlike that obtained with the LPE method.

Next, as in the embodiment described above, channel groove 22 was formed in the top surface of the multi-layered structure by selective etching, using a photoresist film. Note that width w' of the bottom surface of the channel groove and vertical distance h' between the groove bottom surface and active layer 16 were set at 1.5 $\mu$m and 0.7 $\mu$m, respectively, in this embodiment.

After the formation of channel groove 22 described above, the photoresist layer was removed, and the exposed top surface of the multi-layered structure was washed. Then, the second crystal growth step, which used the MOCVD method to form waveguide layer 24, overcoating layer 26 and contact layer 28, was begun. According to the present embodiment, layers 24, 26, and 28 were respectively comprised of a 0.3 $\mu$m thick p-type $Ga_{0.73}Al_{0.27}As$ layer, a 1.25 $\mu$m thick p-type $Ga_{0.6}Al_{0.4}As$ layer, and 5 $\mu$m thick p-type GaAlAs layer (having a Zn concentration of $1 \times 10^8$ cm$^{-3}$). Thereafter, a plurality of electrode layers were formed on the top and bottom of the structure, as in the above-described embodiment, and the laser diode was completed.

The resultant structure was cleaved into a Fabry-Perot laser having a resonator length of 250 $\mu$m. The element had the characteristics of a low threshold current of 35 mA and a good differential quantum efficiency of 50%. Current-light output characteristics having a good linearity without kink were obtained at an output of 50 mW or more. In addition, it was found that the beam waist of a laser light beam radiated from the laser end surface, corresponded to the end surface in the horizontal and vertical directions, and was a good refractive index guide.

It was also found that the above laser had an effective refractive index step $\Delta$neff of about $1 \times 10^{-2}$, and showed a stabilized fundamental transverse mode oscillation up to an output of 30 mW, and there was no mode deformation or higher order mode oscillation at high power.

Figure 4:
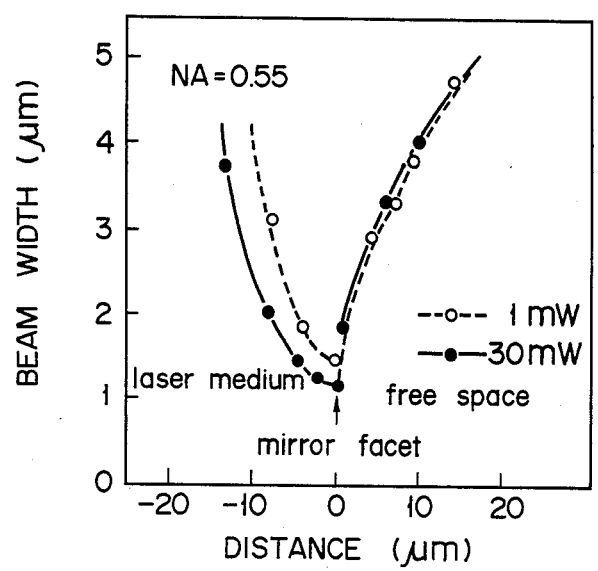
FIG. 4 shows measured curves of full beamwidth at half peak intensity of the laser beam vs. propagation distance from the semiconductor laser diode of FIG. 1.

FIG. 4 shows measurements of full beam width at half the peak intensity along the optical axis of the laser manufactured by the above-described method, wherein reference symbols " ○ " and " ● " are data at 1 mW and 30 mW, respectively. An astigmatism was substantially 0 $\mu$m, and a stabilized wavefront, independent of the power level, was obtained.

In the embodiments described above, it is also an important feature of the present invention that the effective refractive index step $\Delta$neff, inside and outside channel groove 22, is set to be not lower than $6 \times 10^{-3}$, and bottom width w thereof is set to be not higher than 2 $\mu$m. The importance of these value limitations will be described below with reference to FIG. 5.

Figure 5:
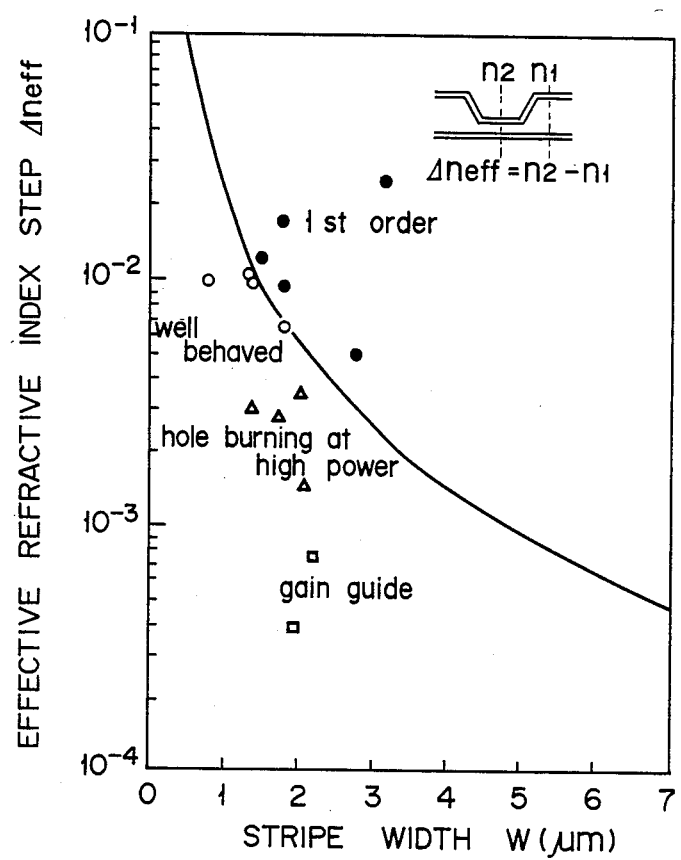
FIG. 5 is a graph showing an effective refractive index step $\Delta$neff and a stripe-like channel groove width w in transverse mode oscillation, up to a light output of 30 mW, in the laser diode of FIG. 1.

FIG. 5 is a graph showing the effective refractive index step $\Delta$neff and stripe-like channel groove width w in transverse mode oscillation, up to a light output of 30 mW, in the laser diode having the above structure.

In general, when a laser has a flat active layer, it is difficult to obtain a sufficiently large effective refractive index distribution of more than $10^{-2}$ for mode confinement. Actually, methods for changing the thickness of the active layer, either by bending it or by making it grow perpendicularly in the groove, have often been used. Such a structure tends to degrade the laser's reliability because of the degradation in quality of the active layer as compared to lasers having a flat active layer. On the other hand, the structure according to the present invention has a flat active layer through appropriate control of the refractive index, the film thickness or the like of the first overcoating layer, and thus an effective refractive index step can be easily formed thereat.

In FIG. 5, symbol " ○ " shows a stabilized transverse-mode oscillation up to a laser output of 30 mW, symbol "$\Delta$" shows a mode deformation caused by a hole-burning phenomenon as the output increases, symbol "□" shows characteristics similar to a gain guide such as kink or mode deformation at a large astigmatism and a current-light output characteristic, and symbol "●" shows a higher order mode. In the drawing, a curve shows a theoretical calculation of channel groove width w of a laser diode when a first-order mode is cut off with respect to effective refractive index step $\Delta$neff.

As is apparent from FIG. 5, according to the structure of the present invention, a stabilized transverse-mode can be obtained from a low power operation up to a high power operation of more than 30 mW, by setting $\Delta$neff to be not smaller than $6 \times 10^{-3}$ and w not larger than 2 $\mu$m.

When $\Delta$neff exceeds $1 \times 10^{-1}$, since the groove width at which a first-order mode is cut off is below 0.5 $\mu$m, not only does the element formation process becomes difficult but also the mode size decreases. As a result, the light output level which causes degradation by end surface breakdown is decreased, and a high power operation becomes impossible. It should be noted that, during the laser diode operation, the actual level of light output which causes the hole-burning phenomenon and the actual degree of adverse influence due to that phenomenon cannot be simply determined. In the actual operation mode of the laser diode, these factors tend to be varied depending upon the layer structure, the gain distribution, the internal power loss of the laser diode. Accordingly, the ranges of values defined above are required to satisfy the characteristic in which a stabilized transverse-mode oscillation is obtained up to a light output of 30 mW, which is the performance required of a light source for writing into an optical disc.

Although the invention has been described with reference to specific embodiments, it should be understood by those skilled in the art that numerous modifications may be made within the spirit and scope of the inventive contribution.

For example, the mix crystal ratio, the film thickness and the like of the cladding layer, the current blocking layer, and the overcoating layer can be changed as needed, within the given range, as long as the effective refractive index step $\Delta$neff is not less than $6 \times 10^{-3}$. The cladding layer and the current blocking layer may be comprised of $Ga_{0.55}Al_{0.45}As$, the first overcoating layer may be comprised of $Ga_{0.65}Al_{0.35}As$, and a film thickness thereof may be 0.4 $\mu$m. Channel groove width w can also be changed as needed with the range of from 0.5 to 2 $\mu$m, and in which the first-order mode is cut off with respect to effective refractive index step $\Delta$neff. In addition, the overcoating layers are not limited to two layers but can be more than three layers, as long as the refractive index of the layer nearest the active layer is higher than the refractive indexes of the layer farthest from the active layer or the cladding layer.

In addition, the material is not limited to GaAlAs, and other compound semiconductor materials such as InGaAsP, AlGaInP, or AlGaZnP can be used. Furthermore, the MBE method, instead of the MOCVD method, can be used as a crystal growth method. It is also possible to use a p-type substrate and to invert the conductivity types of each layer.

What is claimed is:

1. A semiconductor laser diode, comprising:
   (a) a semiconductive substrate of a first conductivity type;
   (b) first and second semiconductive cladding layers of first and second conductivity types, which are sequentially stacked on said substrate;
   (c) an active layer of a semiconductor film sandwiched between said first and second cladding layers;
   (d) a semiconductive current blocking layer of the first conductivity type formed on said second cladding layer, a channel groove being formed in said current blocking layer and said second cladding layer, to be deep enough to cause said current blocking layer to be divided into two parts;
   (e) a semiconductive waveguide layer of the second conductivity type, for covering said channel groove and said current-blocking layer, to provide a slab-coupled waveguide structure for transverse mode oscillation;
   (f) a semiconductive overcoating layer of the second conductivity type formed on said waveguide layer; and
   (g) first and second conductive layers respectively formed on said substrate and said semiconductor overcoating layer to serve as electrodes of said laser diode;
   wherein said second cladding layer, said current blocking layer, and said waveguide layer are formed of a compound semiconductor containing aluminum with said current blocking layer containing aluminum in an amount larger than that contained in said waveguide layer to thereby improve lattice matching characteristics among said second cladding layer, said current blocking layer, and said waveguide layer.

2. The laser diode according to claim 1, wherein said current blocking layer contains aluminum in an amount substantially equal to that contained in said second cladding layer.

3. The laser diode according to claim 1, wherein said channel groove is formed in said current blocking layer and said second cladding layer in a manner so as to have a bottom portion whose width is not larger than 2 micrometers.

4. The laser diode according to claim 3, wherein said second cladding layer, said current blocking layer, and said waveguide layer comprise a gallium arsenide semiconductive material containing aluminum.

5. The laser diode according to claim 4, wherein said second cladding layer, said current blocking layer, and said waveguide layer define a first refractive index measured at the channel groove and a second refractive index measured at the remaining portion of said laser diode, a difference between the first and second effective refractive indexes defining an effective refractive index which is set to be larger than $6 \times 10^{-3}$.

6. The laser diode according to claim 1, wherein said second cladding layer has a first refractive index, while said waveguide layer has a second refractive index larger than the first refractive index.

7. The laser diode according to claim 6, wherein said overcoating layer has a third refractive index smaller than the second refractive index.

* * * * *